United States Patent
De Petris

(10) Patent No.: US 6,528,911 B1
(45) Date of Patent: *Mar. 4, 2003

(54) RECTIFIER ASSEMBLY FOR AUTOMOTIVE ALTERNATORS

(75) Inventor: Peter S. De Petris, Youngstown, NY (US)

(73) Assignee: Electro-Dyn Electronics Corporation, Niagara Falls, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/550,453

(22) Filed: Apr. 17, 2000

Related U.S. Application Data

(62) Division of application No. 09/412,931, filed on Oct. 5, 1999, now Pat. No. 6,327,128.
(60) Provisional application No. 60/139,998, filed on Jun. 18, 1999, provisional application No. 60/130,784, filed on Apr. 23, 1999, provisional application No. 60/129,738, filed on Apr. 16, 1999, provisional application No. 60/129,740, filed on Apr. 16, 1999, provisional application No. 60/103,682, filed on Oct. 8, 1998, and provisional application No. 60/103,412, filed on Oct. 7, 1998.

(51) Int. Cl.[7] .......................... H02K 5/18; H02K 11/00
(52) U.S. Cl. ...................................... 310/64; 310/68 D
(58) Field of Search ............................ 310/68 D, 68 R, 310/66, 52–65; 363/145, 144

(56) References Cited

U.S. PATENT DOCUMENTS

| | | | | |
|---|---|---|---|---|
| 3,684,944 A | * | 8/1972 | Evgrafov et al. ............ 363/126 |
| 3,778,650 A | * | 12/1973 | Tharman ................... 310/68 D |
| 3,812,390 A | | 5/1974 | Richards .................... 310/68 D |
| 3,870,944 A | * | 3/1975 | Ogawa et al. ............... 363/145 |
| 3,959,676 A | | 5/1976 | Striker ....................... 310/68 D |

(List continued on next page.)

OTHER PUBLICATIONS

"Introducing The Renard CS130 Series!," 1 page, The Globe, Mar. 1997.
"Ford IAR Burnup," WAI–Wetherill Associates, Inc., Nov. 1992.
"Preventing Fire Hazards on the Ford IAR Integral Alternator," 1 page, Renard Reader, Feb. 1992.
Weigh Benefits of CS–130 Salvaged Components, 3 pages, Electrical Rebuilder's Exchange, Dec. 1998.
"Adequate Vehicular Electrical Protection Important," 1 page, Electrical Rebuilder's Exchange, Mar. 1998.
"Heat Transfer Compound And Electrical Contact Gel are not the Same," 1 page, Renard Reader, Jun. 1992.

(List continued on next page.)

Primary Examiner—Nestor Ramirez
Assistant Examiner—Guillermo Perez
(74) Attorney, Agent, or Firm—Knobbe, Martens, Olson & Bear, LLP

(57) ABSTRACT

A rectifier bridge assembly is located in the housing of a multi-phase alternating current generator to rectify AC current produced by the alternator into DC current. The rectifier assembly includes at least six semiconductor diodes. The rectifier assembly also includes a positive heat sink positioned in a first plane and a negative heat sink positioned in a second plane, wherein the second plane is parallel to said first plane. The heat sinks have solid copper cavity nests pressed into them to nest and secure semiconductors. The heat sinks are separated from each other by an insulating gasket. Diodes are mounted onto the two heat sinks and are connected to stator field coils wired in a polyphase "Y" circuit. The diodes rectify the alternating current into direct current. The two heat sinks each have three or four semiconductors affixed to them, along with a capacitor. A B+ positive terminal is insulated from a negative terminal by a gasket. Stator terminals are insulated from the heat sinks and are connected to the semiconductors in series with the stator field coils.

6 Claims, 9 Drawing Sheets

U.S. PATENT DOCUMENTS

| | | | |
|---|---|---|---|
| 4,052,631 A | 10/1977 | Kuter | 310/68 D |
| 4,065,686 A | 12/1977 | Moore | 310/68 D |
| 4,137,560 A | 1/1979 | Moore | 363/145 |
| 4,169,282 A | 9/1979 | Allport et al. | 363/145 |
| 4,284,915 A | 8/1981 | Hagenlocher et al. | 310/68 D |
| 4,288,711 A | 9/1981 | Hagenlocher et al. | 310/68 D |
| 4,347,543 A | 8/1982 | Frister et al. | 361/91.6 |
| 4,419,597 A | 12/1983 | Shiga et al. | 310/68 D |
| 4,543,504 A * | 9/1985 | Iwaki et al. | 310/68 D |
| 4,606,000 A | 8/1986 | Steele et al. | 363/145 |
| 4,799,309 A | 1/1989 | Cinzori et al. | 29/596 |
| 4,952,829 A | 8/1990 | Armbruster et al. | 310/68 D |
| 5,005,069 A | 4/1991 | Wasmer et al. | 257/687 |
| 5,043,614 A | 8/1991 | Yockey | 310/68 D |
| 5,451,823 A | 9/1995 | Deverall et al. | 310/68 D |
| 5,659,212 A | 8/1997 | DePetris | 310/68 D |
| 5,955,805 A * | 9/1999 | Chaudoreille et al. | 310/90 |
| 6,121,699 A * | 9/2000 | Kashihara et al. | 310/68 D |
| 2002/0041476 A1 * | 4/2002 | Petris | 361/103 |

OTHER PUBLICATIONS

"Reliability in Rectifiers for Late Model Ford Integral: The Answer is Quality Workmanship," 1 page, Renard Reader, Sep. 1991.

"Solving the Mystery of Regulator Failure," 1 page, Electrical Rebuilder's Exchange, Aug. 1995.

P. Moore, "Prepare Now for the CS130D," 1 page, Electrical Rebuilder's Exchange, Apr. 1996.

N. De Nardis, "Delco CS–Series Heat Problems," 2 pages, Automotive Rebuilder, Mar. 1995.

* cited by examiner

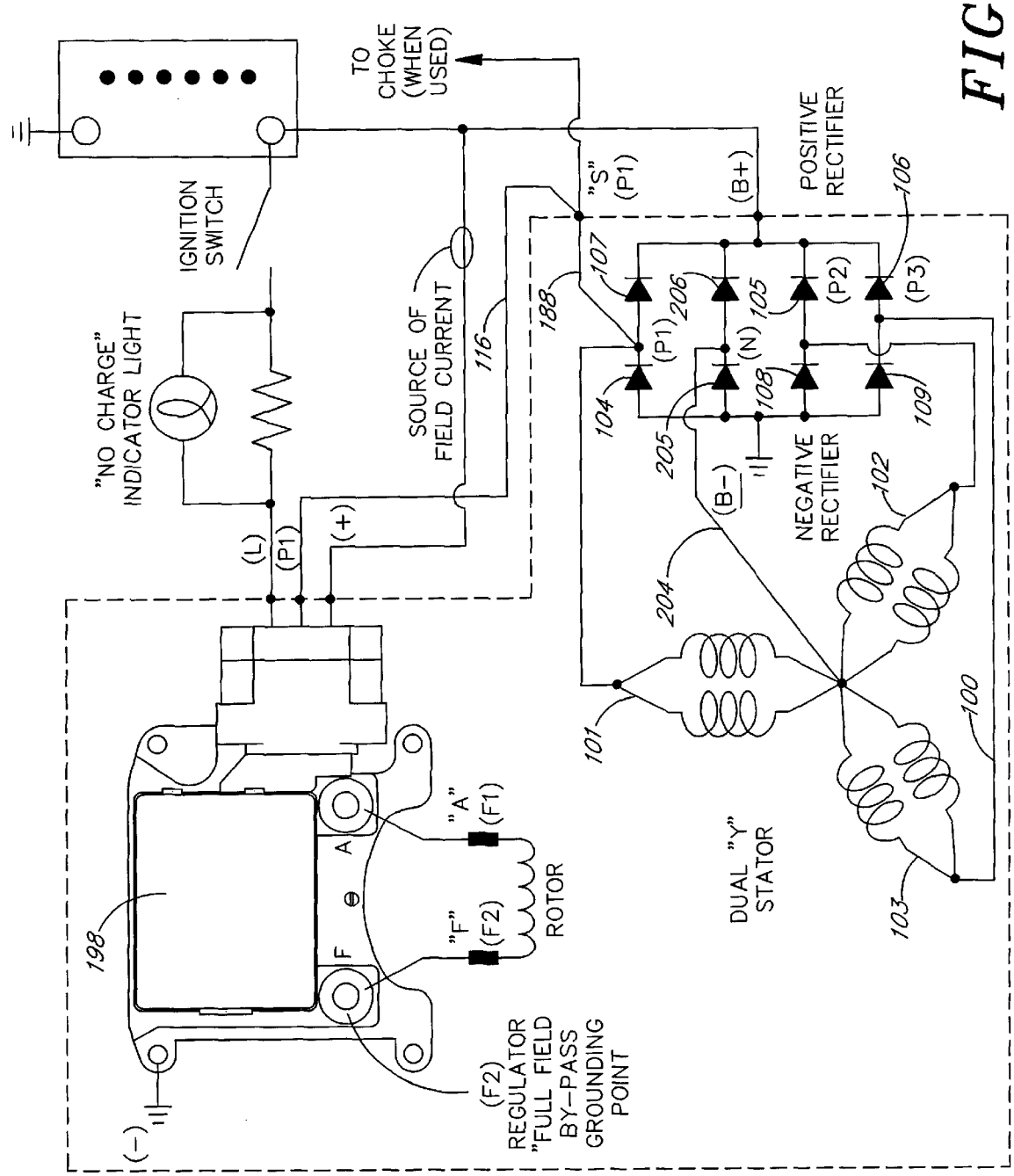

RECTIFIER ASSEMBLY FOR AUTOMOTIVE ALTERNATORS

RELATED APPLICATIONS

The application claims priority under 35 U.S.C. §119(e) from U.S. Provisional Patent Application No. 60/129,740, filed on Apr. 16, 1999, and from U.S. provisional Patent Application No. 60/130,784, filed on Apr. 23, 1999. This application also is a division of and claims the benefit of priority under 35 U.S.C. §120 to U.S. patent application Ser. No. 09/412,931, filed Oct. 5, 1999 (now U.S. Pat. No. 6,327,128), which claims the benefit of priority under 35 U.S.C. §119(e) to U.S. Provisional Patent Application No. 60/103,682, filed Oct. 8, 1998, U.S. Provisional Patent Application No. 60/103,412, filed Oct. 7, 1998, U.S. Provisional Patent Application No. 60/129,738, filed Apr. 16, 1999, and U.S. Provisional Patent Application No. 60/139,998, filed Jun. 18, 1999.

BACKGROUND OF THE INVENTION

1. Field of the Invention

The present invention relates to automotive-type rectifier assemblies used to convert polyphase alternating current to direct current using silicon semiconductor diodes. More particularly, the invention deals with the high power and under-hood temperatures required by modem day automobiles and the problems associated with overheated and stressed semiconductors. Further, the invention relates to the complex manufacturing and operational problems associated with the sensitivity of semiconductors to the heat, stress and mechanical forces, as well as a method of manufacturing semiconductors, thus eliminating these problems.

2. Description of the Related Art

Much work has been done in the past to decrease manufacturing costs, air pollution and weight, thus decreasing the alternator's size. Paradoxically, the electrical energy requirements increased. Compact alternators operating under these conditions cannot dissipate heat out of the rectifier bridge fast enough to prevent semiconductor failures. This is particularly true during the summer months when the ambient temperatures are quite high, providing minimal heat transfer and a higher alternator failure rate.

The present invention addresses these problems, especially the replacement expenses for the remanufacturing industry, the general public, and also the wasted energy.

The present invention is further concerned with state of the art manufacturing, because of the chip's extreme sensitivity to the thermal and mechanical stresses associated with it. The invention described herein avoids the stresses by never exceeding the semiconductor's technical and handling specifications. The new and novel invention decreases the horrendous alternator failure and return rate caused by the semiconductors. This is a general nuisance for the public, costing millions of dollars, for towing, repairs and replacement alternators, wasting energy and generating unnecessary air pollution.

The prior art teaches that polyphase alternating current can be converted to direct current by conducting it through six or more semiconductors pressed into prepunched holes in the rectifier heat sinks used in the automobiles' alternators, as illustrated by U.S. Pat. Nos. 5,043,614 and 5,712,517, which are incorporated by reference herein.

The above type inventions are complex to manufacture because the semiconductor chip's extreme sensitivity to the heat, stress and mechanical forces applied during the manufacturing of rectifier bridges causes production failures and causes premature catastrophic failures during the vehicle operation.

Historical data collected from returned alternators under warranty indicate their semiconductors have a very high mortality rate. Historically, 74% fail within the first month's operation, 15% during the next 2 months, 4% after 3 months and 7% during the next 4 months. This failure rate can be directly correlated to manufacturing damage.

This is especially so because silicon semiconductor chips are extremely fragile, being only 0.180×0.180×0.007 inches thick (the thickness of three human hairs), making them so sensitive to the pressure, stress and heat, which are all required to press them into the state of art rectifier bridges.

When chips this thin are soldered inside the bottom of a thick copper cylinder and then filled with an epoxy, a solid mass is formed. Being solid, the chip has no clearance for thermal or stress relief, all transmitted into them during soldering, installation and the alternator operation. Therefore, if a prestressed, overheated chip does not fail during the manufacturing and testing, if damaged, it will likely fail in the alternator, exposed to the constant heating, cooling and load changes. Thus, the chips have a high morality rate.

Most press-fit rectifier bridges incorporate two heat sinks, one usually being a positive aluminum heat sink, the other being the negative die-case aluminum rear alternator housing. They are separated from each other by a heat conductive, electrical insulator gasket or a ceramic coating on the housing, which is a very expensive process. Both of the heat sinks have prepunched or machined holes for at least three press-fit semiconductors. The cathodes of the first three are pressed into the positive heat sink, and the anodes of the other three are pressed into the negative heat sink. At least three stator terminals, stamped out of copper, are usually encapsulated into a plastic assembly. Each has two locating holes to affix a positive set and a negative set of semiconductor leads in series, along with a slot, which connects a set of stator field leads between them.

The first set of stator terminals connects the anode lead from the first positive semiconductor to the cathode of the first negative semiconductor, thereby forming a set of series connected semiconductors between the two heat sinks. The leads from the alternator's polyphase field winding is affixed into the slot, which connects it between the series diodes, as described above. The next two sets of semiconductors are similarly connected to the second and third sets field windings, completing the polyphase field circuits. A lead for the voltage regulator is also affixed between the third set of semiconductors. A stud is affixed to the positive heat sink to complete the B+ circuit to the positive post of the battery. Likewise, the negative heat sink completes the charging system's circuit to the negative post when the alternator is installed.

Prior to assembling the rectifier bridge, a thin coating of thermally conductive grease is applied onto the surfaces of the heat sinks in an attempt to increase the heat transfer out of the semiconductors affixed to the positive heat sinks, through the insulator gasket and into the aluminum die-cast rear housing, into the cooling air flow. However, the semiconductor chips are affixed deep into thick copper cylinders, surrounded by an epoxy filler, thus delaying the heat transfer out of them and causing even more chip failures.

The automotive industry being very competitive, continually requires cost efficiency and less failures.

SUMMARY OF THE INVENTION

State of the art rectifier bridges using pressed-in semiconductors are a continuous nuisance and problem for the general public, requiring expensive service calls, towing and repairs. It is the object of the present invention to eliminate this costly nuisance by eliminating these failure problems, further advancing the state of the art by its unique design, creating a method of manufacturing the bridge rectifier without stressing or damaging the sensitive semiconductor chips inside the diodes. It also instantly dissipates their heat out directly into the outside cooling air, being affixed directly onto copper assemblies and stator terminals, which are in direct contact with the cooling air flow. The thermal transfer (compound) gasket also transfers the heat directly into the housing and to the outside cooling air quicker.

The invention is so unique that thousands of dollars can be saved by using it to remanufacture existing rectifier bridges discussed above. This is accomplished by machining off the upper section of the press-fit copper cylinders (removing the plastic and chip section), which is then pressed out of the sinks. The blank copper slugs are placed into hydraulic press fixtures and pressed into solid copper cavity nest assemblies, which will then nest the pan and/or button type semiconductors.

The newly formed copper assemblies are then pressed back into the existing heat sinks, without chips. The reused copper not only decreases the manufacturing cost but also saves our precious earth elements and the energy required to manufacture new ones. The present invention is especially unique because it decreases the horrendous failure problems associated with the present state of the art rectifier bridges, which is the primary cause of alternator failures. However, the known bridges are remanufactured, only to fail again, because the remanufacturers have no choice but to press in the same type semiconductors that failed (which will fail again).

The invention provides a bridge rectifier assembly which is manufactured in a new and simplified production manner, using stamped and molded parts in a new and novel form, so that pan or button type semiconductor diodes can replace the present press fit type diodes.

Typically, the diodes are affixed onto preformed copper cavity nest assemblies, which can be formed utilizing sintered copper slugs or punched out solid copper strips and/or by reusing the remanufactured copper diode cylinders and hydraulically forming into cavity nest assemblies which are then pressed into the existing heat sink holes, without the sensitive semiconductors affixed onto them. They can also be assembled using the two copper heat sinks, with the nest cavities formed into them, in accordance with U.S. Pat. No. 5,659,212, which is incorporated by reference herein. The commercial state of the art press-fit type semiconductors are not required with the present invention.

Stator terminals are also stamped out of copper, having two holes for the semiconductor diode leads, but without slots for the stator field coils, as used on the state of the art rectifiers. The present invention has preformed bends, which can be aligned with the stator leads, then crimped after placing special type copper cups over them, eliminating the possible hazardous soldering process, which is also very time consuming and costly, and which also exposes the chips to further damage.

The present invention also utilizes a new and unique insulator manufactured out of a type of melamine formaldehyde, molded, glass-fiber filler, having most of the inside area cut out, so that a heat sink compound, such as Dow Corning 340, can be filled into the cut out area for better heat transfer, and also having a very high compression strength rating. This invention can also be used as a high strength heat transfer gasket for mounting silicon controlled rectifiers and other types of transistors and/or components requiring high thermal transfer and torque down strength.

A preferred embodiment of the present invention utilizes at least six spring-loaded diodes affixed onto two copper heat sinks, which operate cooler and more efficiently as previously described here and also in my existing U.S. Pat. No. 5,659,212, which is incorporated by reference herein.

The heat sinks with the semiconductors affixed onto them are separated by a thermally conductive, electrical insulating type gasket, with only a peripheral border allowing the center cutout area to be filled with a thermal heat transfer compound as described previously above.

The cathodes from three semiconductors form the positive heat sink and the anodes from three others form the negative sink. A lead connects the anode of the first positive semiconductor to the cathode of the first negative semiconductor, thereby forming a set of series connected semiconductors between the two heat sinks. A lead from the alternator's polyphase field winding is also affixed between the two diodes. The next two sets of semiconductors are similarly connected, completing the polyphase circuits. A lead for the voltage regulator and electric choke (if used) is also affixed between the third set of semiconductors. A B+ stud connected to the positive heat sink completes the circuit to the positive post of the battery. The negative heat sink completes the charging system's circuit to the negative battery post when the alternator is installed.

Typically, the stator terminals are riveted to the heat sinks and insulated from them by nylon bushings. A spring compressed between the stator terminal and the semiconductor locates and applies pressure to affix the semiconductor's contact against the copper heat sink nest, assuring an excellent electrical and thermal contact; however, they can be affixed to the heat sinks without the compressed springs, if required for cost savings. The crimp-type terminals also decrease the rebuilder's manufacturing cost, eliminating potential damage to the semiconductor.

One aspect of the present invention is the manufacturing of bridge rectifiers using compression springs, stamped out parts and terminals, so that the pan or button type diodes can be used successively, whereby the expensive computerized presses are not required (which are used in prior processes to attempt to prevent fractured and stressed chips).

State of the art rectifier bridges primarily use press-fit semiconductors because prior to the present invention, the diodes tended to become unsoldered during momentary power surges, floating off the heat sink, causing them to lose contact and causing the alternator to fail. The paradox is that using a higher melting solder causes the semiconductor chips inside the diodes to be possibly damaged and fail, whereas the press-fit diodes do not require soldering. However, the present invention allows any semiconductor diode now to be soldered and gently held in place by the springs, even if the solder remelts. The manufacturer's compression, torque and thermal shock specifications are never exceeded. Their life is also extended because they operate cooler. The use of a thermal transfer gasket also eliminates the ceramic flame spraying and/or epoxy dipping processes, required by the state of the art bridge rectifiers, to insulate the heat sinks from each other and to transfer the heat out of them, both being very expensive operations and not as efficient as with my gasket.

The longer life and decreased productive losses also decreases air pollution by requiring less manufacturing energy, thus saving the environment.

BRIEF DESCRIPTION OF THE DRAWINGS

FIG. 2 illustrates a schematic diagram for a Ford "3G" eight semiconductors rectifier bridge.

DETAILED DESCRIPTION OF THE PREFERRED EMBODIMENT

The preferred embodiment of my rectifier bridge assembly will now be described in two forms. The first form is illustrated using the pan type semiconductor diodes, affixed into cavity nests pressed formed into two copper heat sinks. The next form illustrates the same type diodes, which are affixed into copper cavity nest assemblies after the copper cavity nest inserts are pressed into both aluminum heat sink holes.

Figure 1:
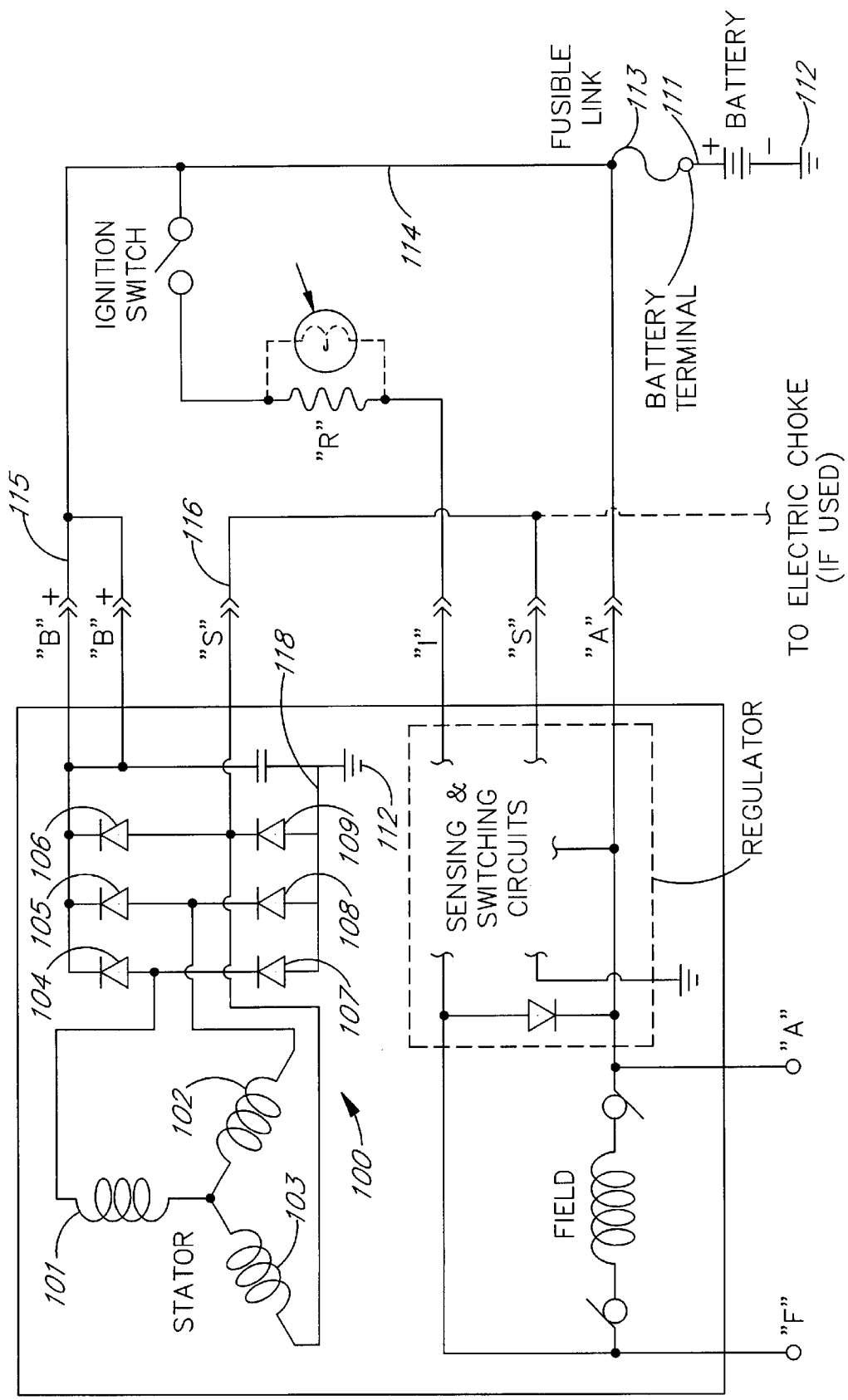
FIG. 1 illustrates a schematic diagram for a Ford "2G" six semiconductor alternator rectifier bridge.

FIG. 1 illustrates a typical rectifier bridge located in the rear housing of an alternator. The rectifier bridge circuit 100 is connected to the stator windings 101, 102, and 103 and completes the polyphase alternator "Y" circuit. The stator field lead 101 connects to the anode of the positive semiconductor 104 and to the cathode of the negative semiconductor 107, which are connected in series. Likewise, the anode of the semiconductor 105 and the cathode of the semiconductor 108 are connected in series and are connected to the field lead 102. The anode of the semiconductor 106 and the cathode of the semiconductor 109 are connected in series and are connected to the field lead 103. The anodes of the semiconductors 107, 108 and 109, along with the ground lead of the capacitor 110, are connected to the rear alternator housing, completing the negative ground circuit 112 when installed in the automobile. The cathodes of semiconductors 104, 105 and 106 all connect together, and, in this instance, terminate at the B+ stud, insulated from the alternator housing. The B+ stud is connected to the automobile wiring harness 114 to complete the positive voltage circuit to the battery through the fuse link 113.

FIG. 2 shows connections of the stator field coils 101 to semiconductors 104 and 107. Likewise, stators 102 and 103 are similarly connected to the semiconductors 108 and 105, and to the semiconductors 109 and 106, respectively. The center "Y" connects to the diodes 205 and 206. The diodes 107, 106, and 206 have their cathodes affixed to the positive heat sink. The anodes of the diodes 104, 108, 109 and 205 are all affixed to the negative heat sink.

Figure 3A:
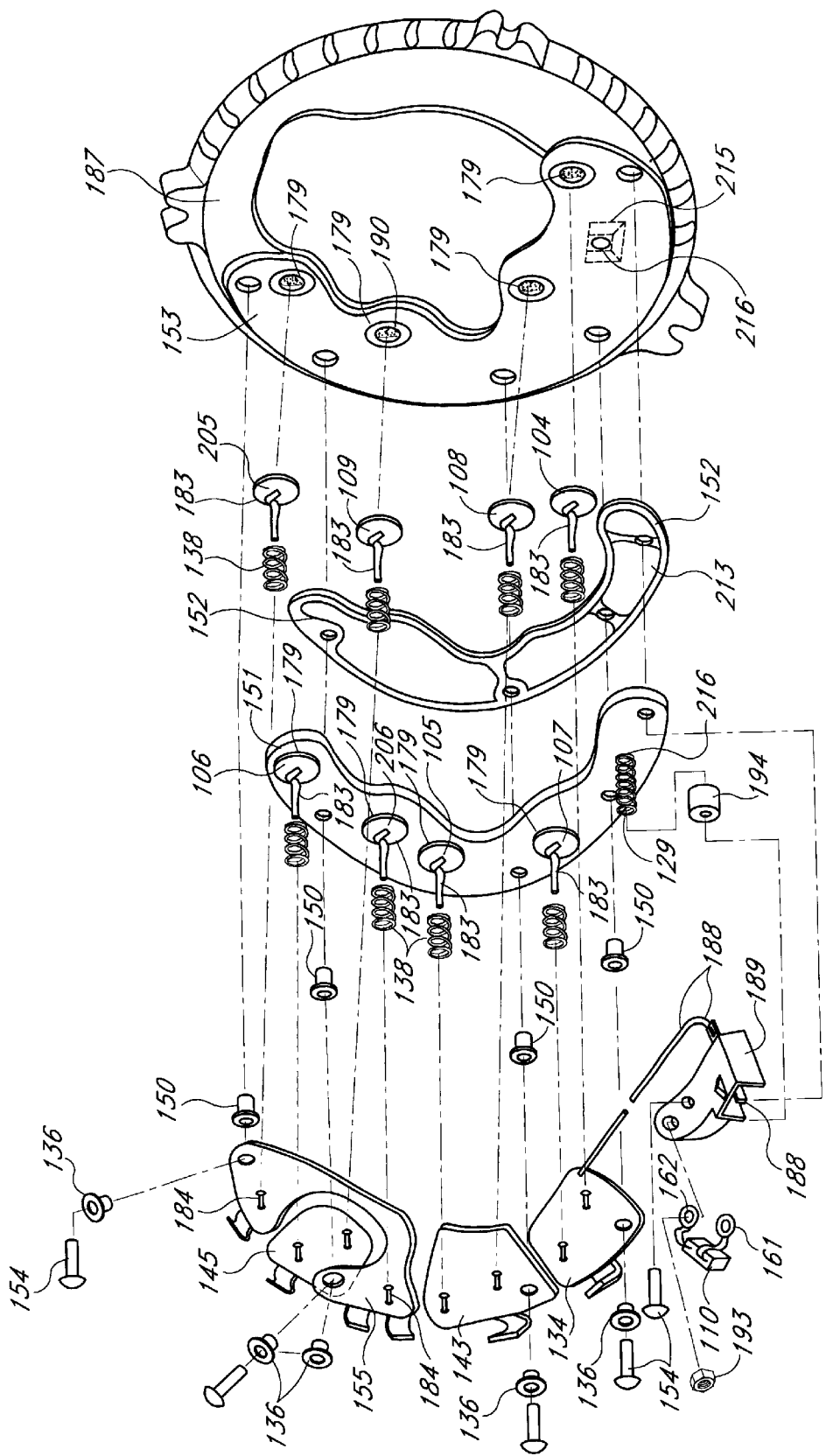
FIG. 3A is a pictorial illustration of a complete rectifier bridge assembly using two copper heat sinks with formed cavity nests pressed therein.

FIG. 3A illustrates the entire rectifier bridge assembly, which has two copper heat sinks 151 and 153 with four formed cavity nests 179 formed pressed into each heat sink to locate and secure button or pan type semiconductor assemblies 183. Solder paste is dispensed into each of the nests 179 on both heat sinks, and the eight pan type semiconductor assemblies 183 (with the compression springs) are placed into the respective nests 179 (according to polarity), and both sinks are passed through a re-flow soldering furnace and allowed to cool down slowly to avoid thermal shock to the semiconductors. This process affixes the semiconductors to the heat sinks.

The die-cast alternator rear housing 187 is placed onto the disappearing anvil pins of a riveting machine. The disappearing anvil pins extend up through the rivet holes to align the housing. A thin coating of thermal compound is applied onto the heat sink area of the rear housing 187 prior to placing the negative heat sink 153 on the rear housing 187. A thermal gasket 152 is then placed on top of it using the anvil pins for alignment. Heat transfer compound is then dispensed into the open areas 213 of the gasket 152. The positive heat sink 151 is then positioned onto the gasket 152, along with the insulator stand-off bushings 150. The positive heat sink 151 is followed by the stator terminals 134, 143, 155 & 145, which self-align themselves to the diode leads 180.

Rivet head insulators 136 are then placed on the anvils and extend above the stator terminals. The rectifier assembly is then riveted together, compressing the springs between the terminals and semiconductors.

Figure 3B:
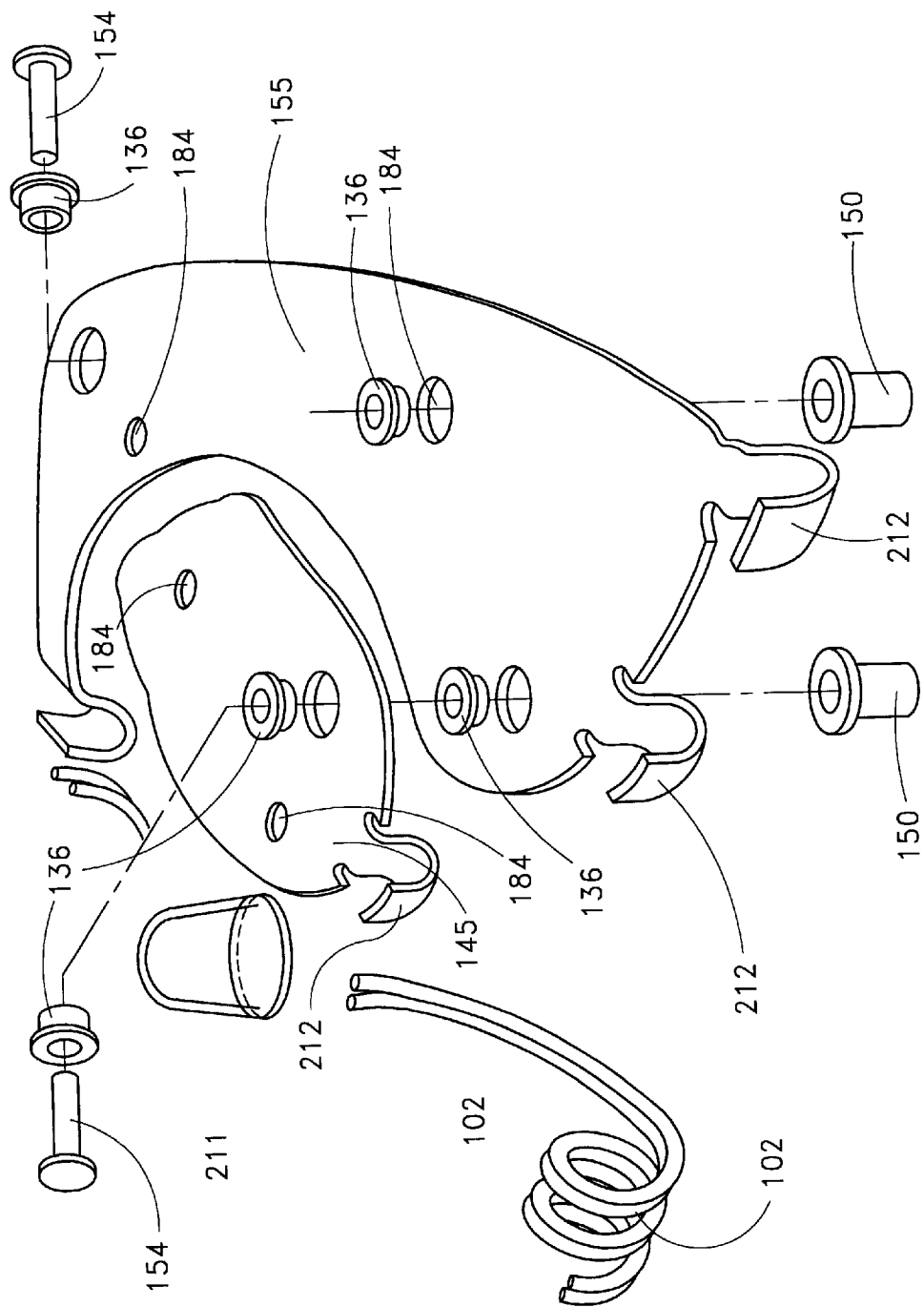
FIG. 3B is a pictorial illustration which shows the stator terminals, the stand-off insulators and the crimped or stapled leads in more detail.

As shown in FIG. 3B, stator lead terminals 212 are positioned vertically to align the stator lead terminals 212 with the stator field coil leads 102 so that the stator lead terminals and the stator field leads can be stapled or crimped together using a crimp cup 211, thus eliminating the solder connections. The insulated stand off bushings 150 are shown separating the terminals 155 and 145 from the heat sinks. The bushings 136 separate the terminals 155 and 145 from each other. The third bushing 136 insulates the rivethead 154.

Figure 3C:
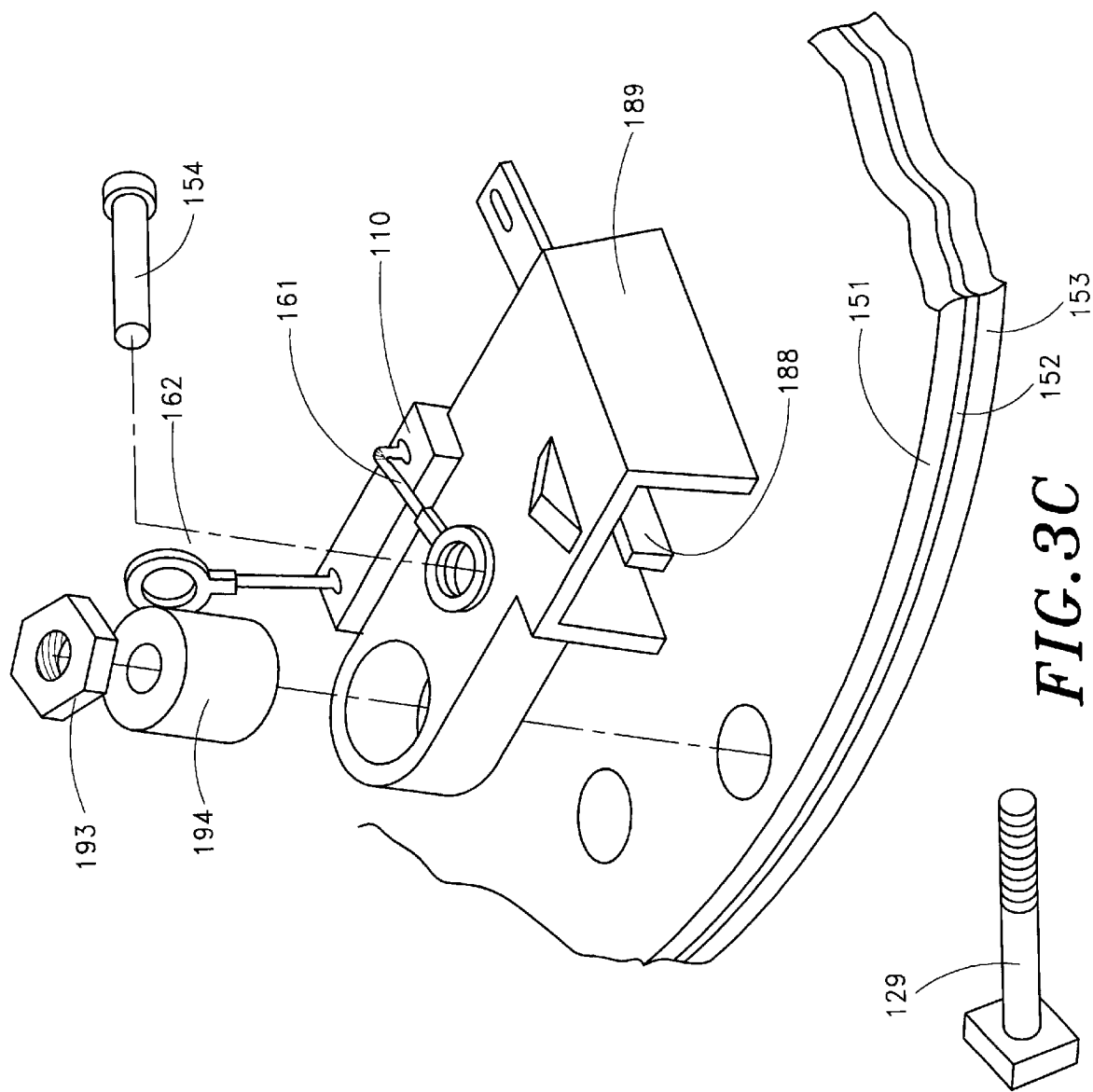
FIG. 3C is a pictorial illustration of the terminal housing showing the capacitor, spacer and a stud with a nut.

As shown in FIG. 3C, a connector 189 houses a terminal 188, and also affixes a lead 161 from the capacitor 110 to the negative heat sink 153 by the rivet 154. The other lead 162 of the capacitor 110 connects the positive heat sink 151 through a stud 129, a spacer 194 and a nut 193. The spacer 194 prevents the connector 189 from being crushed.

Figure 3D:
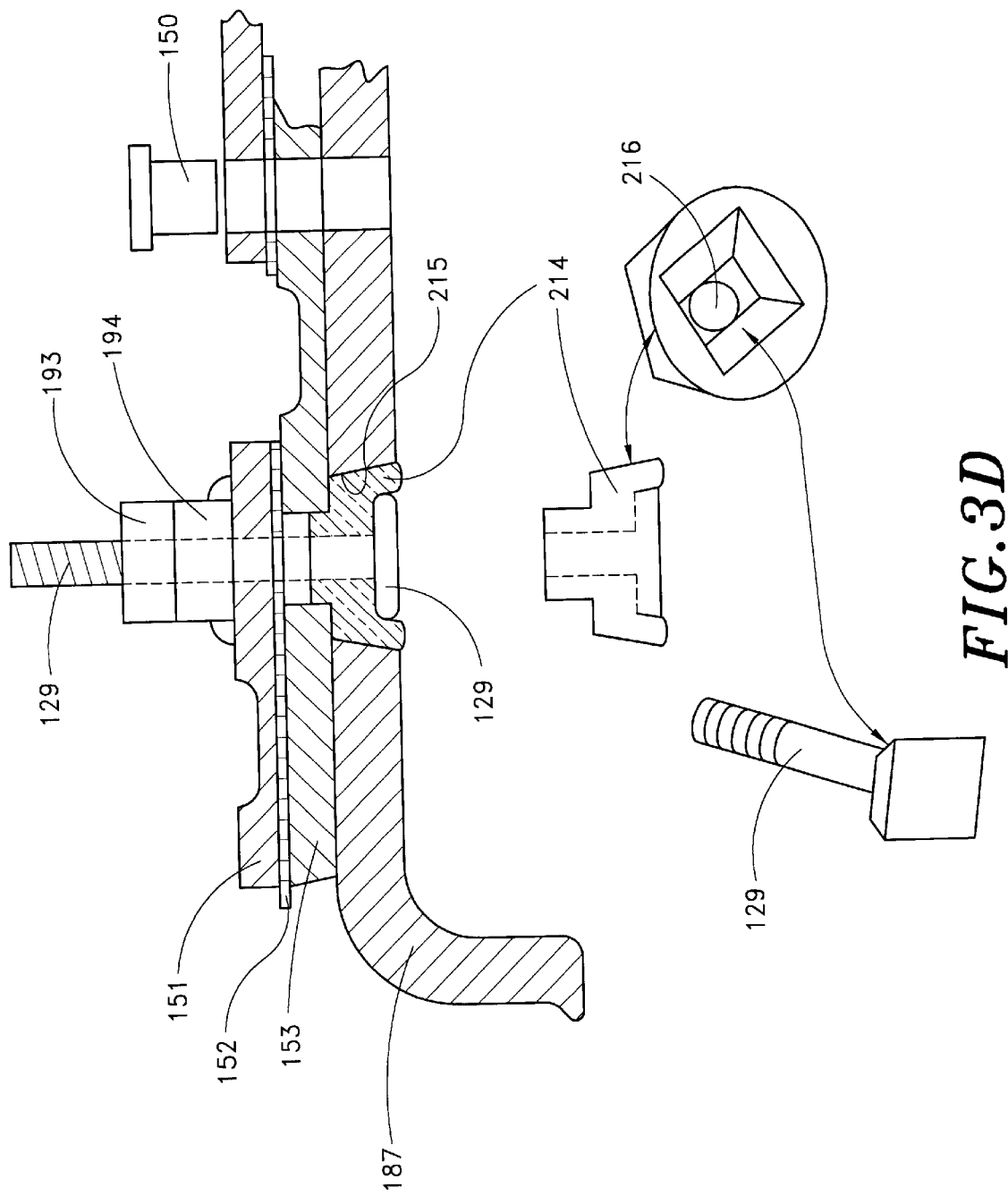
FIG. 3D is an assembly view of a positive stud assembly.

As shown in more detail in FIG. 3D, a plastic insulator 214 fits into a hole 215 in the heat sink 153. The insulator 214 has a hole 216 which receives the positive stud 129. The insulator 214 separates and insulates the positive stud 129 from the negative heat sink and the housing 187. The metal spacer 194 and nut 193 connect the positive stud 129 to the positive heat sink 151 The tapered square type head on the stud and plastic insulator 214 prevents them from rotating when the battery lug is connected and torqued down.

After completing the foregoing steps, solder is dispensed onto each of the eight diode leads 180 extending through the stator terminal holes 184, along with the terminal 188 connected to the stator terminal 134. The completed assembly is then sent through the reflow soldering furnace to affix all the semiconductor leads 180 to the stator terminals without stressing the semiconductor chips.

Figure 4A:
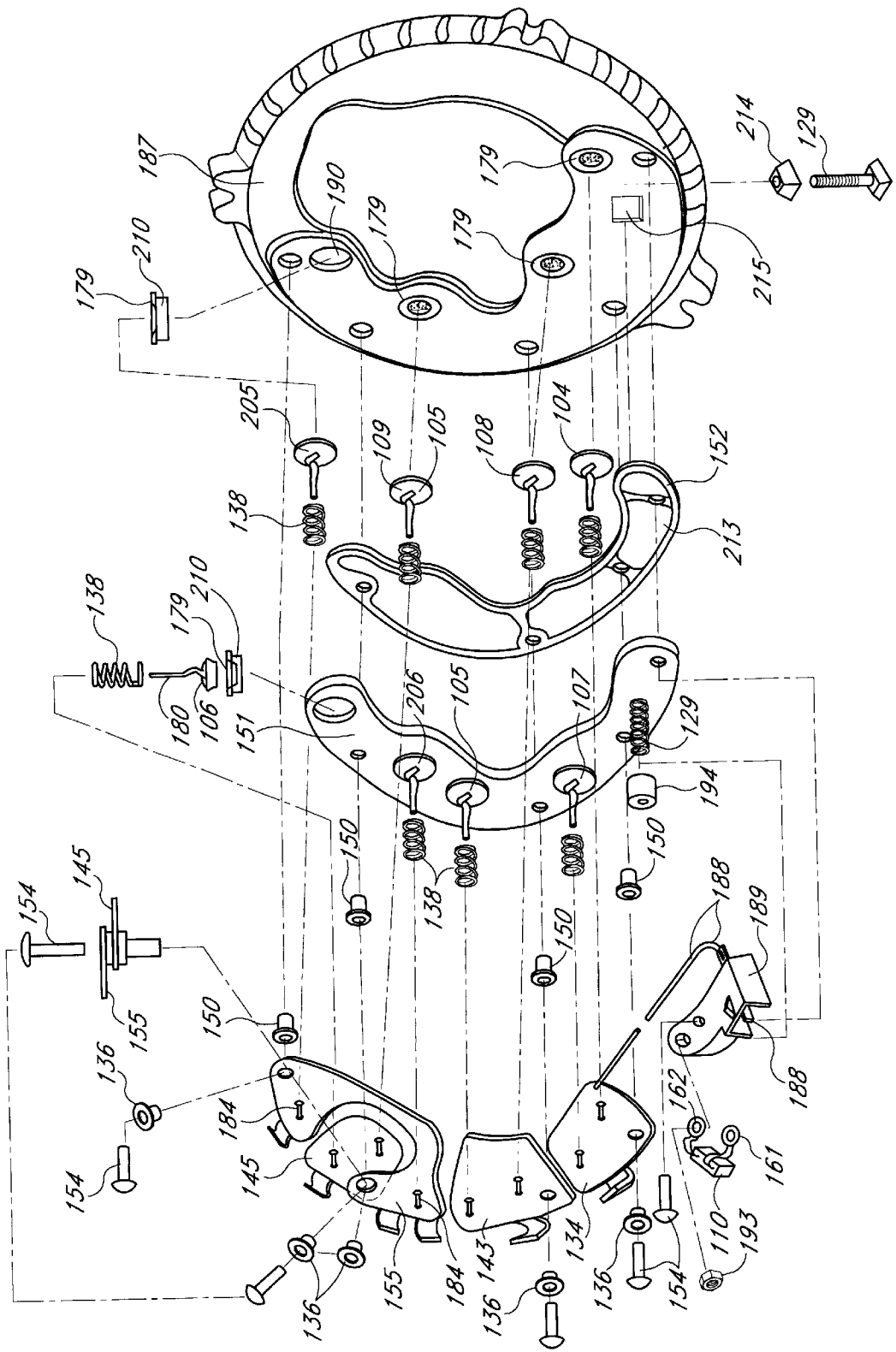
FIG. 4A is a pictorial illustration of a complete rectifier bridge assembly using tapered copper slugs with cavity nests formed therein.

FIG. 4A illustrates still another preferred embodiment of my invention, which utilizes tapered copper slugs 210. The slugs 210 have cavity nests 179 and peripheral shoulders. The slugs 210 are pressed into the holes 190 in both heat sinks. Solder paste is then dispensed into each of these nests. The pan diodes are placed into the nests (according to polarity) and are then processed through the reflow furnace as previously explained.

After cooling, the assemblies (with their pan diodes affixed) are placed onto the same type riveting machine and anvils as discussed with respect to the previous embodiment; by placing the rear housing 187 on the riveting machine and anvils. The electrical insulating gasket 152, the thermal compound, the positive heat sink 151, the compression springs 138, the stand off bushings 150, the stator terminals 134, 143, 155 145 the rivet head insulator washers 136 are then positioned as discussed above. The bridge rectifier assembly is then riveted together, and includes the capacitor 110, the terminal housing 189 and the stud assembly 129, as seen in FIG. 3C. It should be understood that the stator terminals, capacitor and B+ stud 129 could be formed and installed as a unit, separated by plastic. Solder paste is dispensed at each of the eight semiconductor leads 180 to cover the diode leads 180 and the terminal connections 188. The completed assembly is then passed through the solder reflow furnace to affix the leads to the stator terminals.

Figure 4B:
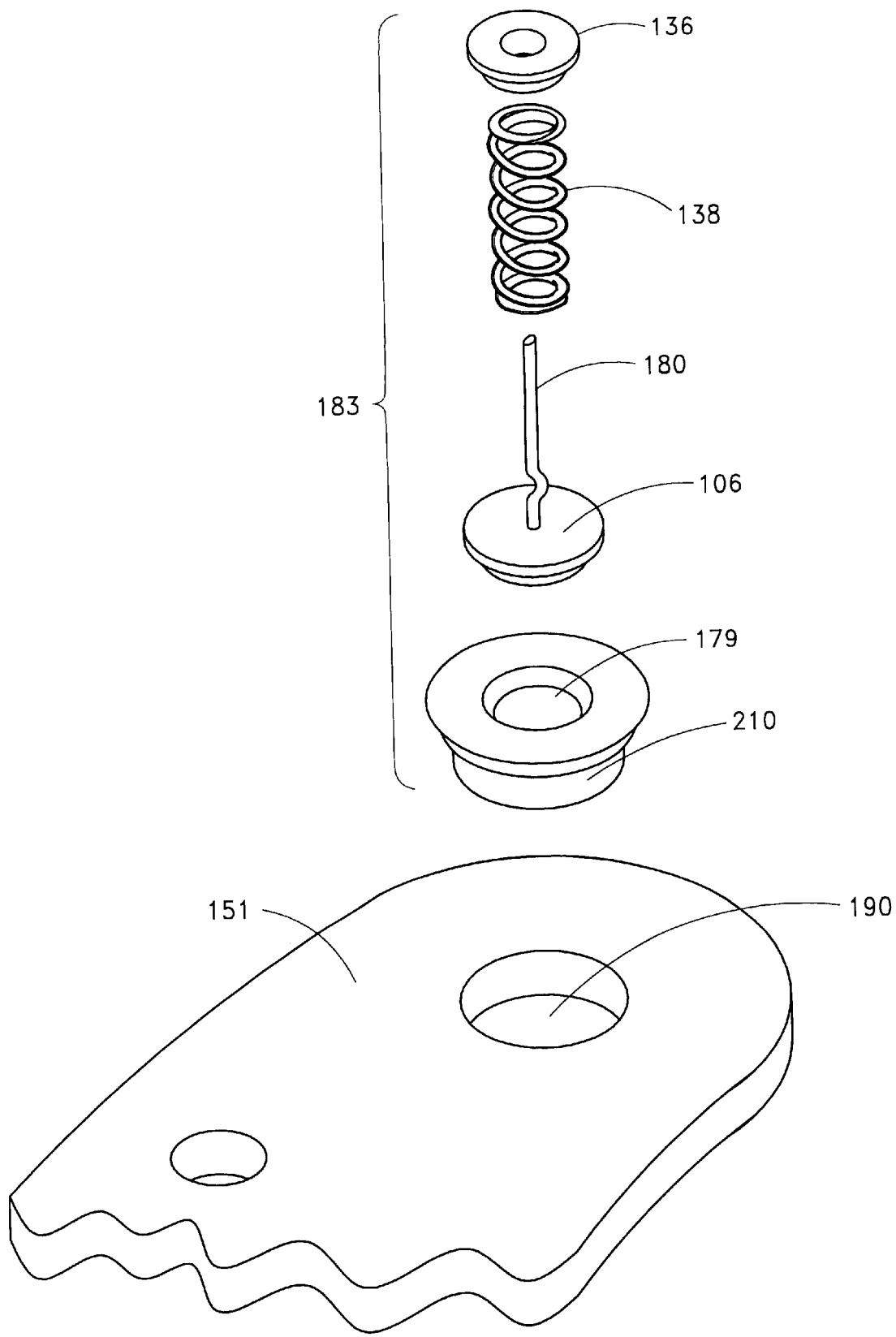
FIG. 4B is an enlarged pictorial side view of the solid copper cavity nest insert of FIG. 4A showing a pan type diode and compression spring prior to being pressed into the heat sink hole.

FIG. 4B illustrates a solid copper diode cavity nest assembly 210 prior to being pressed into the heat sink hole 190. After pressing, solder paste is dispensed into the nest 179. The pan diodes (illustrated by the diode 106) are placed into the cavity nests and processed as described above.

Figure 4C:
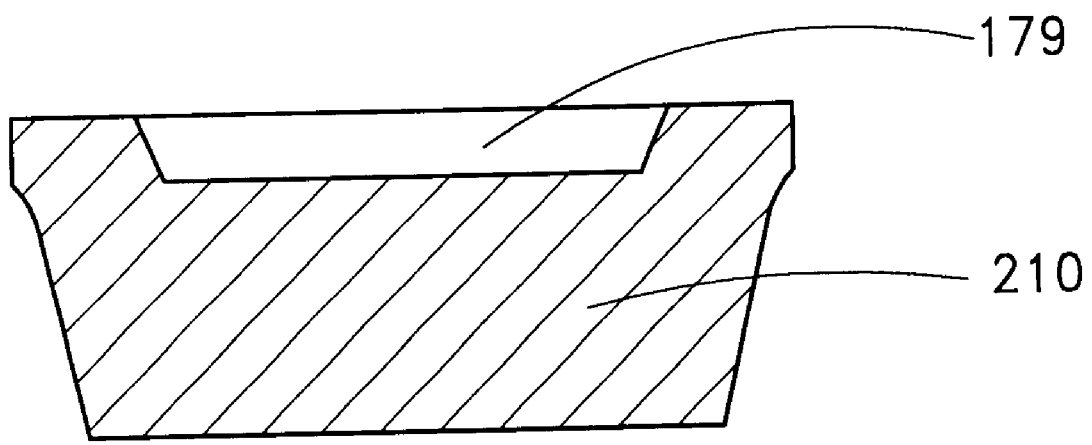
FIG. 4C is a side view of a solid copper cavity nest insert.

FIG. 4C shows the solid copper cavity nest assembly 210 and the nest 179 prior to insertion into one of the holes 190.

The stator field coils 101, 102 and 103 of the polyphases 1, 2 and 3 are affixed to the stator terminals 134, 143 and 145, which connect to the anodes of the positive semiconductors 107, 105 and 106 and also to the cathodes of the negative semiconductors 104, 108 and 109. The anodes of the negative semiconductors are affixed to the B– negative circuit to ground. The cathodes of the positive semiconductors are affixed to the B+ positive circuit of the battery.

The center "Y" connection from the stator field coil is affixed to the N lead 204, which terminates at the stator terminal 155, completing their circuits to the cathodes of the negative semiconductors 205 and to the anodes of the positive semiconductors 206.

Having thus described the preferred embodiments of my rectifier bridges assemblies, assembled without stress from pressing or overheating them during the solder operations, will be apparent that modifications and variations are possible without departing from the scope of my invention defined in the appended claims.

What is claimed is:

1. A rectifier bridge assembly, located in the housing of a multi-phase alternating current generator to rectify AC current produced by the alternator into DC current, said rectifier assembly comprising of at least six semiconductor diodes and also comprising:

a positive heat sink positioned in a first plane and a negative heat sink positioned in a second plane, parallel to said first plane, the heat sinks having solid copper cavity nests pressed into them to nest and secure semiconductors and being separated from each other by an insulating gasket, wherein the gasket is stamped out to contact the heat sinks with a peripheral contact only and the cutout section is filled with a heat transfer compound;

diodes mounted onto two heat sinks and connected to stator field coils wired in a polyphase "Y" circuit, which rectify the alternating current into direct current, the two heat sinks each having three or four semiconductors affixed to them, along with a capacitor, and having a B+ positive terminal insulated from a negative terminal by a gasket; and stator terminals insulated from the heat sinks and connected to said semiconductors in series with said stator field coils.

2. The assembly as defined in claim 1, wherein the heat sinks have preformed solid copper cavity nest inserts, which are pressed into any type heat sink so that diodes other than press fit diodes can be used with existing type heat sinks.

3. The assembly as defined in claim 2, wherein the inserts can be used to reclaim and remanufacture rectifier bridges by replacing press-fit diodes with pan-type diodes or button-type diodes.

4. The assembly as defined in claim 3, wherein the solid copper inserts are reclaimed from press-fit diodes.

5. The assembly as defined in claim 1, wherein the stator terminals have a formed section which can be aligned with stator wire leads and stapled together with a metal staple or crimped together with a crimp-type cup to create an electrical bond.

6. The assembly as defined in claim 1, wherein the stator terminals have vertical sections aligned with stator leads and a copper type cup, which crimps them all together.

\* \* \* \* \*